(12) United States Patent
Cho

(10) Patent No.: US 11,894,405 B2
(45) Date of Patent: Feb. 6, 2024

(54) IMAGE SENSOR PACKAGE

(71) Applicant: Samsung Electronics Co., Ltd., Suwon-si (KR)

(72) Inventor: Kyongsoon Cho, Incheon (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 315 days.

(21) Appl. No.: 17/331,092

(22) Filed: May 26, 2021

(65) Prior Publication Data
US 2022/0139984 A1  May 5, 2022

(30) Foreign Application Priority Data

Nov. 4, 2020 (KR) .................. 10-2020-0146318

(51) Int. Cl.
*H01L 27/146* (2006.01)

(52) U.S. Cl.
CPC .. *H01L 27/14623* (2013.01); *H01L 27/14618* (2013.01); *H01L 27/14636* (2013.01); *H01L 27/14685* (2013.01)

(58) Field of Classification Search
CPC ......... H01L 27/14623; H01L 27/14618; H01L 27/14636; H01L 27/14685; H01L 23/04; H01L 24/14; H01L 24/17; H01L 24/46; H01L 24/49
See application file for complete search history.

(56) References Cited

U.S. PATENT DOCUMENTS

| | | |
|---|---|---|
| 4,015,366 A | 4/1977 | Hall, III |
| 4,280,590 A | 7/1981 | Polizzi |
| RE31,023 E | 9/1982 | Hall, III |
| 4,973,011 A | 11/1990 | Wilson |
| 5,314,070 A | 5/1994 | Ciarlei |
| 5,619,839 A | 4/1997 | Peppard et al. |
| 6,392,309 B1 | 5/2002 | Wataya et al. |
| 6,780,015 B2 | 8/2004 | Swaine et al. |
| 7,239,937 B2 | 7/2007 | Slemker et al. |
| 7,356,379 B2 | 4/2008 | Slemker et al. |
| 8,304,708 B2 | 11/2012 | Shimoda et al. |
| 8,477,223 B2 | 7/2013 | Itonaga |
| 8,828,629 B2 | 9/2014 | Kaneko et al. |
| 9,167,228 B2 | 10/2015 | Monari et al. |
| 9,991,301 B2 | 6/2018 | Yamamoto et al. |
| 10,312,276 B2 | 6/2019 | Chien et al. |
| 10,717,581 B2 | 7/2020 | Sullivan et al. |
| 2009/0267170 A1* | 10/2009 | Chien ............... H01L 27/14618 257/434 |
| 2011/0281064 A1 | 11/2011 | Murphy et al. |
| 2012/0012606 A1 | 1/2012 | Longley et al. |
| 2015/0255500 A1* | 9/2015 | Akahoshi ............... H01L 24/19 257/434 |
| 2016/0107009 A1 | 4/2016 | Cordani |
| 2016/0107010 A1 | 4/2016 | Cordani |

(Continued)

*Primary Examiner* — Jonathan Han
(74) *Attorney, Agent, or Firm* — Muir Patent Law, PLLC

(57) ABSTRACT

An image sensor package includes a package substrate; an image sensor chip disposed on the package substrate; a dam structure disposed on the image sensor chip and including a dam main body having an opening and a first light absorption layer disposed on an inner wall of the dam main body; a transparent substrate on the dam structure; and an encapsulant contacting the image sensor chip and an outer wall of the dam main body.

19 Claims, 20 Drawing Sheets

(56) References Cited

U.S. PATENT DOCUMENTS

| | | |
|---|---|---|
| 2016/0172399 A1 | 6/2016 | Nakata |
| 2017/0098272 A1 | 4/2017 | Brockman et al. |
| 2018/0226447 A1 | 8/2018 | Miao et al. |
| 2018/0359437 A1 | 12/2018 | Watanabe |
| 2019/0043904 A1* | 2/2019 | Chien ............... H01L 27/14618 |
| 2019/0082152 A1 | 3/2019 | Aistov |
| 2020/0083270 A1 | 3/2020 | Yamamoto |
| 2020/0111829 A1* | 4/2020 | Fan .................. H01L 27/14683 |
| 2020/0312897 A1* | 10/2020 | Hsieh ............... H01L 27/14683 |
| 2020/0350357 A1* | 11/2020 | Hung ............... H01L 27/14618 |

* cited by examiner

IMAGE SENSOR PACKAGE

CROSS-REFERENCE TO RELATED APPLICATION

This application is based on and claims priority under 35 U.S.C. § 119 to Korean Patent Application No. 10-2020-0146318, filed on Nov. 4, 2020, in the Korean Intellectual Property Office, the disclosure of which is incorporated by reference herein in its entirety.

BACKGROUND

The inventive concept relates to an image sensor package.

Image sensors that photograph a subject and convert the subject into electrical signals are used not only in general consumer electronic devices such as digital cameras, mobile phone cameras, and portable camcorders, but also cameras mounted on automobiles, security devices, and robots. Recently, in accordance with the rapid development of the electronics industry and user demand, electronic devices are more compact and lightweight, and accordingly, packages including image sensors have been required to be compact and lightweight.

SUMMARY

The inventive concept provides an image sensor package.

According to an aspect of the inventive concept, there is provided an image sensor package including: a package substrate; an image sensor chip on the package substrate; a dam structure on the image sensor chip and including a dam main body having an opening and a first light absorption layer on an inner wall of the dam main body; a transparent substrate on the dam structure; and an encapsulant contacting the image sensor chip and an outer wall of the dam main body.

According to another aspect of the inventive concept, there is provided an image sensor package including: an image sensor chip including a sensing region including a plurality of unit pixels and an outer region around the sensing region; a transparent substrate on the image sensor chip; and a dam structure disposed between the outer region of the image sensor chip and the transparent substrate and including a black pigment.

According to another aspect of the inventive concept, there is provided an image sensor package including: an image sensor chip including a sensing region including a plurality of unit pixels and an outer region around the sensing region; a dam main body disposed on the outer region of the image sensor chip and including an opening; a package substrate disposed on the dam structure and including a through hole communicating with the opening of the dam structure; a transparent substrate disposed on the package substrate to cover the through hole of the package substrate; and a light absorption layer disposed on at least one of an inner wall of the dam main body defining the opening and an inner wall of the package substrate defining the through hole of the package substrate.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1:
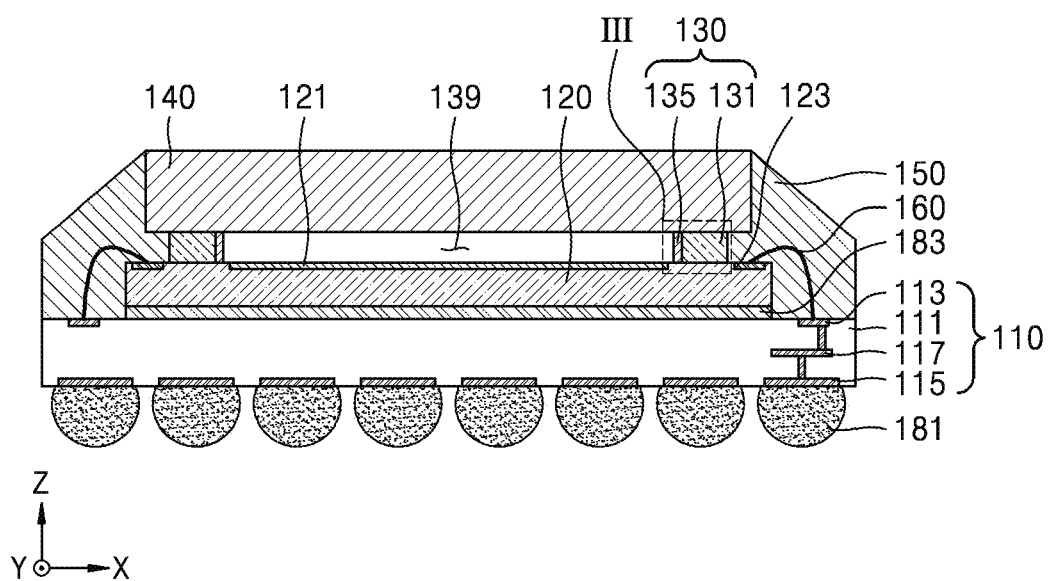
FIG. 1 is a cross-sectional view of an image sensor package according to example embodiments of the inventive concept.

Hereinafter, embodiments of the inventive concept will be described in detail by referring to the accompanying drawings. Like reference numerals will be used for like elements in the drawings, and repeated descriptions thereof will not be given.

Figure 2:
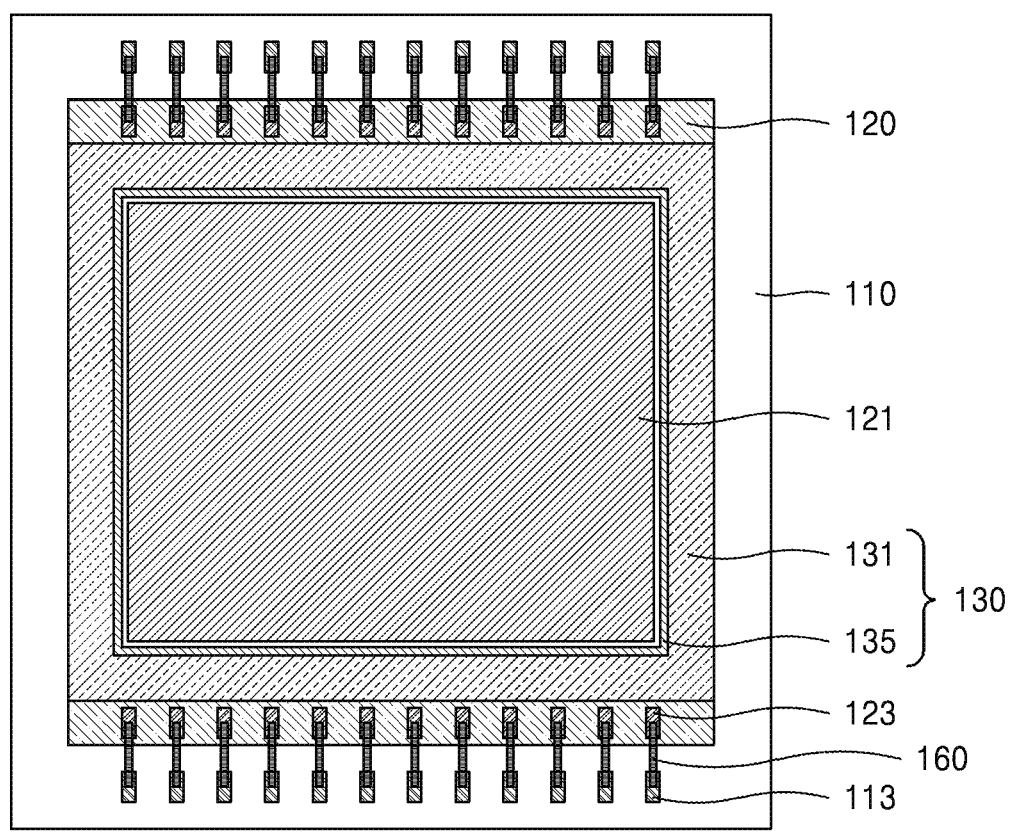
FIG. 2 is a plan view of the image sensor package of FIG. 1 from which a transparent substrate and an encapsulant are removed.
Figure 3:
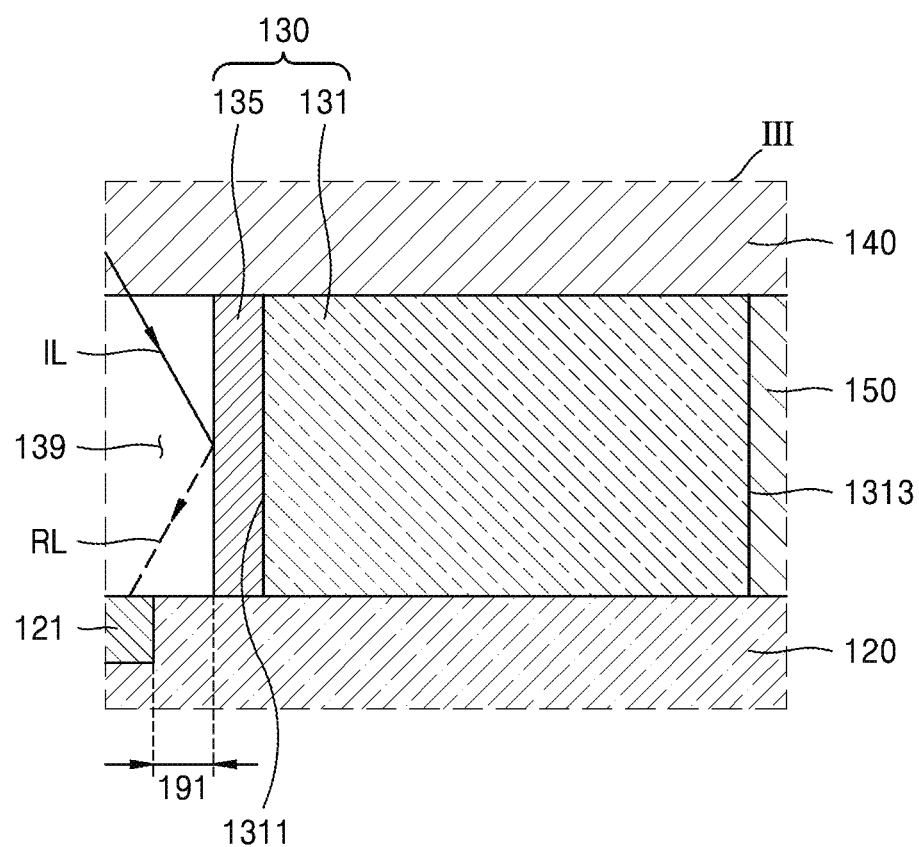
FIG. 3 is an enlarged cross-sectional view of a region III in FIG. 1.

FIG. 1 is a cross-sectional view of an image sensor package 100 according to example embodiments of the inventive concept. FIG. 2 is a plan view of the image sensor package 100 of FIG. 1 from which a transparent substrate 140 and an encapsulant 150 are removed. FIG. 3 is an enlarged cross-sectional view of a region III in FIG. 1.

Referring to FIGS. 1 to 3, the image sensor package 100 may include a package substrate 110, an image sensor chip 120, a dam structure 130, the transparent substrate 140, and the encapsulant 150.

The package substrate 110 may be, for example, a printed circuit board (PCB). The package substrate 110 may include a substrate base 111 including at least one material selected from among phenol resin, epoxy resin, and polyimide. For example, the substrate base 111 may be formed of a resin, e.g., a resin plate. In addition, the package substrate 110 may include an upper substrate pad 113 disposed on an upper surface of the substrate base 111 and a lower substrate pad 115 disposed on a lower surface of the substrate base 111. An inner wiring pattern 117 configured to electrically connect the upper substrate pad 113 to the lower substrate pad 115 may be provided in the substrate base 111. Although not particularly shown in FIG. 1, the package substrate 110 may further include an upper passivation layer that covers the upper surface of the substrate base 111 and has an opening exposing the upper substrate pad 113, and a lower passivation layer that covers the lower surface of the substrate base 111 and has an opening exposing the lower substrate pad 115.

As used herein, components described as being "electrically connected" are configured such that an electrical signal can be transferred from one component to the other (although such electrical signal may be attenuated in strength as it is transferred and may be selectively transferred).

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

For example, the upper substrate pad 113 and the lower substrate pad 115 may each include or be formed of a metal such as copper (Cu), aluminum (Al), tungsten (W), titanium (Ti), tantalum (Ta), indium (In), molybdenum (Mo), manganese (Mn), cobalt (Co), tin (Sn), nickel (Ni), magnesium (Mg), rhenium (Re), beryllium (Be), gallium (Ga), or ruthenium (Ru), or a combination thereof.

The upper substrate pad 113 may be a pad to which a conductive connection member for electrically connecting the package substrate 110 to the image sensor chip 120 is connected. For example, a conductive wire 160 may extend between the upper substrate pad 113 of the package substrate 110 and a connection pad 123 of the image sensor chip 120, and electrically connect the connection pad 123 of the image sensor chip 120 to the upper substrate pad 113 of the package substrate 110.

The lower substrate pad 115 may function as a pad to which an external connection terminal 181 is attached. The external connection terminal 181 may be connected to the lower substrate pad 115 through an opening of the lower passivation layer. The external connection terminal 181 may be, for example, a solder ball. The external connection terminal 181 may electrically connect the image sensor package 100 to an external device.

The image sensor chip 120 may be mounted on the package substrate 110. The image sensor chip 120 may include a first surface and a second surface opposite to the first surface. For example, the image sensor chip 120 may be attached onto an upper surface of the package substrate 110 through a chip adhesion member (a chip adhesive) 183 disposed on the second surface of the image sensor chip 120. The chip adhesion member 183 may include or may be, for example, a die attach film. For example, the image sensor chip 120 may include a complementary metal-oxide-semiconductor (CMOS) image sensor (CIS) and/or a charge-coupled device (CCD).

The first surface of the image sensor chip 120 may include a sensing region 121 and an outer region around the sensing region 121.

The sensing region 121 of the image sensor chip 120 may include a pixel array including a plurality of unit pixels. The plurality of unit pixels may be arranged in the form of a two-dimensional array on the first surface of the image sensor chip 120. The plurality of unit pixels may be, for example, an array of passive pixel sensors or an array of active pixel sensors. The plurality of unit pixels may each include a photodiode sensing light, a transfer transistor transferring a charge generated by the photodiode, a floating diffusion region storing the transferred charge, a reset transistor periodically resetting the floating diffusion region, and a source follower buffering a signal according to a charge in the floating diffusion region.

A plurality of color filters and a plurality of micro lenses sequentially disposed on the plurality of unit pixels may be disposed on the sensing region 121 of the image sensor chip 120. The plurality of color filters may include, for example, a red (R) filter, a blue (B) filter, and a green (G) filter. Alternatively, the plurality of color filters may include a cyan (C) filter, a yellow (Y) filter, and a magenta (M) filter. One of the R filter, the B filter, and the G filter or one of the C filter, the Y filter, and the M filter may be disposed on each of the plurality of unit pixels. The plurality of unit pixels may each recognize a single color (e.g., one of the above describe colors) by sensing components of separate incident light. The plurality of micro lenses may concentrate light incident on the sensing region 121 to the plurality of unit pixels.

The outer region of the image sensor chip 120 may be a region around the sensing region 121 and may include a region to which the dam structure 130 is attached. In addition, the outer region of the image sensor chip 120 may include a pad region in which the connection pad 123 is disposed. The connection pad 123 may be electrically connected to the plurality of unit pixels in the sensing region 121. The connection pad 123 may include or be formed of a metal such as Cu, Al, W, Ti, Ta, In, Mo, Mn, Co, Sn, Ni, Mg, Re, Be, Ga, or Ru, or a combination thereof.

The dam structure 130 may be disposed on the outer region of the image sensor chip 120. The dam structure 130 may be disposed on the image sensor chip 120 to surround the sensing region 121 in a plan view so that the sensing region 121 of the image sensor chip 120 is not covered by the dam structure 130. The dam structure 130 may include an opening 139 for exposing the sensing region 121 of the image sensor chip 120. A plane area of the opening 139 of the dam structure 130 may be greater than a plane area of the sensing region 121 of the image sensor chip 120. For example, the dam structure 130 may have a rectangle shape having a rectangular opening 139 in the middle, and the area of the opening 139 in a plan view may be greater than the area of the sensing region 121 in the plan view. The dam structure 130 may have a ring shape continuously extending along an edge of the sensing region 121 in a plan view. For example, the dam structure 130 may have a rectangular ring shape.

The transparent substrate 140 may be disposed on the dam structure 130. The transparent substrate 140 may be attached onto the dam structure 130 so that the opening 139 of the dam structure 130 is covered by the transparent substrate 140. As the transparent substrate 140 is disposed to cover the opening 139 of the dam structure 130, a cavity may be formed between the first surface of the image sensor chip 120, a lower surface of the transparent substrate 140, and the dam structure 130.

The transparent substrate 140 may include or be formed of a material having a high light transmittance rate. For example, the transparent substrate 140 may include or be formed of glass or a polymer. For example, the transparent substrate 140 may further include a filter for passing or blocking light of a particular wavelength band.

The encapsulant 150 is disposed on the package substrate 110 and may surround the image sensor chip 120, the dam structure 130, and the transparent substrate 140. For example, the encapsulant 150 may be formed to cover a side wall of the image sensor chip 120, an outer wall 1313 of the dam structure 130, and a side wall of the transparent substrate 140. The encapsulant 150 may not cover an upper surface of the transparent substrate 140 so that the upper surface of the transparent substrate 140 may be exposed. For example, the encapsulant 150 may be formed by injecting an insulating resin onto the package substrate 110 and curing the insulating resin. While the encapsulant 150 is formed, the dam structure 130 may block flow of a material constituting the encapsulant 150 into the inside of the opening 139 of the dam structure 130, thereby preventing the encapsulant 150 from being filled between the sensing region 121 and the transparent substrate 140.

In example embodiments, the encapsulant 150 may include or be formed of an epoxy-group molding resin, a polyimide-group molding resin, or the like. For example, the encapsulant 150 may include or be formed of an epoxy molding compound (EMC).

In embodiments of the inventive concept, the dam structure 130 may include a light absorbing material configured to absorb light IL incident on the dam structure 130. For example, the dam structure 130 may include a black pigment, and at least a portion of the dam structure 130 may be colored black.

In example embodiments, the dam structure 130 may include a dam main body 131 and a first light absorption layer 135 disposed on a surface of the dam main body 131.

The dam main body 131 may extend continuously along the edge of the sensing region 121 of the image sensor chip 120 and may include the opening 139. The dam main body 131 may have a ring shape surrounding the sensing region 121 in a plan view. The dam main body 131 may include an inner wall 1311 defining the opening 139 and the outer wall 1313 covered by the encapsulant 150. For example, the dam main body 131 may include at least one selected from among polyimide, epoxy, and a metal.

The first light absorption layer 135 may be disposed on the inner wall 1311 of the dam main body 131 defining the opening 139. The first light absorption layer 135 may be formed to cover at least a portion of the inner wall 1311 of the dam main body 131. The first light absorption layer 135 may entirely cover the inner wall 1311 of the dam main body 131, or may partially cover the inner wall 1311 of the dam main body 131. In a plan view, the first light absorption layer 135 may have a ring shape continuously extending along the inner wall 1311 of the dam main body 131. In addition, the first light absorption layer 135 may extend from a lower end of the inner wall 1311 of the dam main body 131 to an upper end thereof. For example, the first light absorption layer 135 may extend from a bottom of the inner wall 1311 of the dam main body 131 to a top of the inner wall 1311 of the dam main body 131.

A light absorption rate of the first light absorption layer 135 may be between about 90% to about 100%. In example embodiments, the light absorption rate of the first light absorption layer 135 may be 95% or more. Here, the light absorption rate may refer to an average absorption rate for light in a wavelength band of the light IL incident on the first light absorption layer 135. For example, the light IL may be visible light, and the light absorption rate may be calculated with respect to visible light. For example, the light absorption rate may be calculated with respect to a wavelength band between 300 nm and 740 nm.

In example embodiments, the first light absorption layer 135 may include a light absorbing material. For example, the first light absorption layer 135 may include a black pigment. For example, the first light absorption layer 135 may include a carbon-group color pigment or a carbon-group colorant. For example, the first light absorption layer 135 may include carbon black. When the first light absorption layer 135 includes a black pigment, the inner wall 1311 of the dam structure 130 may be colored black. When the inner wall 1311 of the dam structure 130 is colored black, the light IL incident on the dam structure 130 may be mostly absorbed by the dam structure 130, and an amount of reflected light RL reflected from the dam structure 130 may be significantly reduced.

According to example embodiments of the inventive concept, because the inner wall 1311 of the dam structure 130 includes the first light absorption layer 135 including a material having a high light absorption rate, light may be prevented from being reflected from the dam structure 130 and irradiated to the sensing region 121 of the image sensor chip 120. Accordingly, a flare phenomenon, which occurs by the reflected light RL that is reflected from the dam structure 130 and reaches the sensing region 121 of the image sensor chip 120, may be prevented, and thus, the quality of an image obtained using the image sensor chip 120 may be improved. For example, the flare phenomenon may be a phenomenon that one or more pixels of the image sensor chip 120 receive reflected light from a dam structure 130 or another in addition to intended incident light from an object so that an image formed by the image sensor chip 120 has a brighter region than an intended and/or supposed image at a corresponding region to the one or more pixels of the image sensor chip 120. The flare phenomenon may degrade the image quality of images obtained by the image sensor chip 120 because brightness of an image obtained by the image sensor chip 120 in part does not correspond to the real image.

In addition, according to example embodiments of the inventive concept, because the flare phenomenon due to the reflection of light from the dam structure 130 is prevented, the dam structure 130 may be disposed to be adjacent to the sensing region 121 of the image sensor chip 120. For example, a distance 191 between the dam structure 130 and the sensing region 121 of the image sensor chip 120 may be 80 μm or less. Because the dam structure 130 may be disposed to be adjacent to the sensing region 121 of the image sensor chip 120, a size of the outer region of the image sensor chip 120 may be reduced, and accordingly, miniaturization of the image sensor chip 120 and miniaturization of the image sensor package 100 may be achieved.

The image sensor package 100 may further include a memory chip and/or a logic chip, in addition to the image sensor chip 120. In example embodiments, the image sensor package 100 may include a 3D-CIS stack structure in which the image sensor chip 120, the logic chip, and the memory chip are stacked in a vertical direction (e.g., a Z-direction) on the package substrate 110. In example embodiments, the image sensor package 100 may include different types of chips, components such as passive elements/components, and the like, which are electrically connected to each other and configured to operate as one system.

For example, the memory chip may include a volatile memory chip and/or a nonvolatile memory chip. The volatile memory chip may include or may be, for example, a dynamic random access memory (DRAM), a static RAM (SRAM), a thyristor RAM (TRAM), a zero capacitor RAM (ZRAM), or a twin transistor RAM (TTRAM). The nonvolatile memory chip may include or may be, for example, a flash memory, a magnetic RAM (MRAM), a spin-transfer torque MRAM (STT-MRAM), a ferroelectric RAM (FRAM), a phase change RAM (PRAM), a resistive RAM (RRAM), a nanotube RRAM, a polymer RAM, or an insulator resistance change memory. For example, the logic chip may include or may be a microprocessor, a graphics processor, a signal processor, a network processor, a chipset, an audio codec, a video codec, and/or an application processor.

Figure 4:
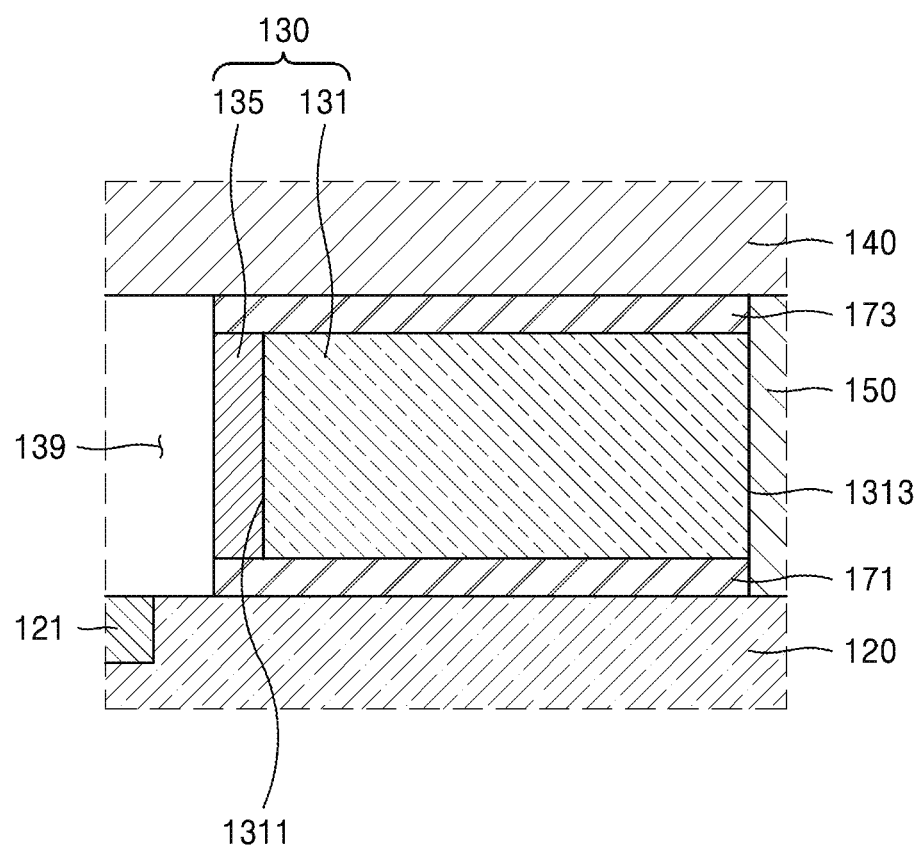
FIGS. 4 to 6 are each a cross-sectional view of a portion of an image sensor package according to example embodiments of the inventive concept.
Figure 5:
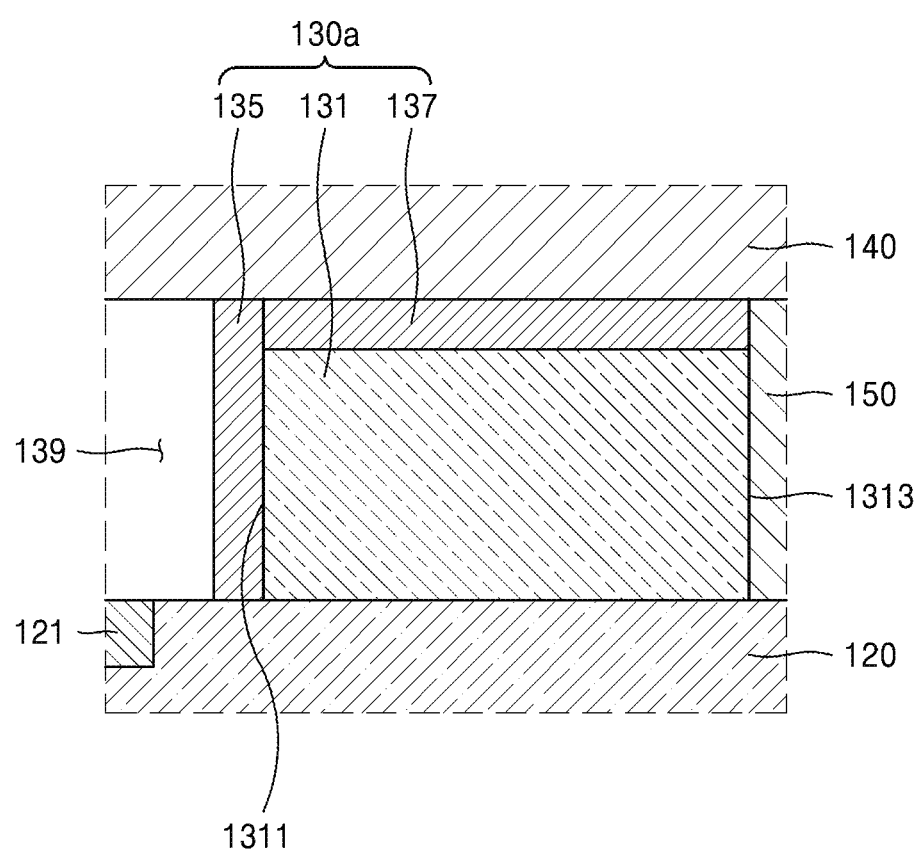
Figure 6:
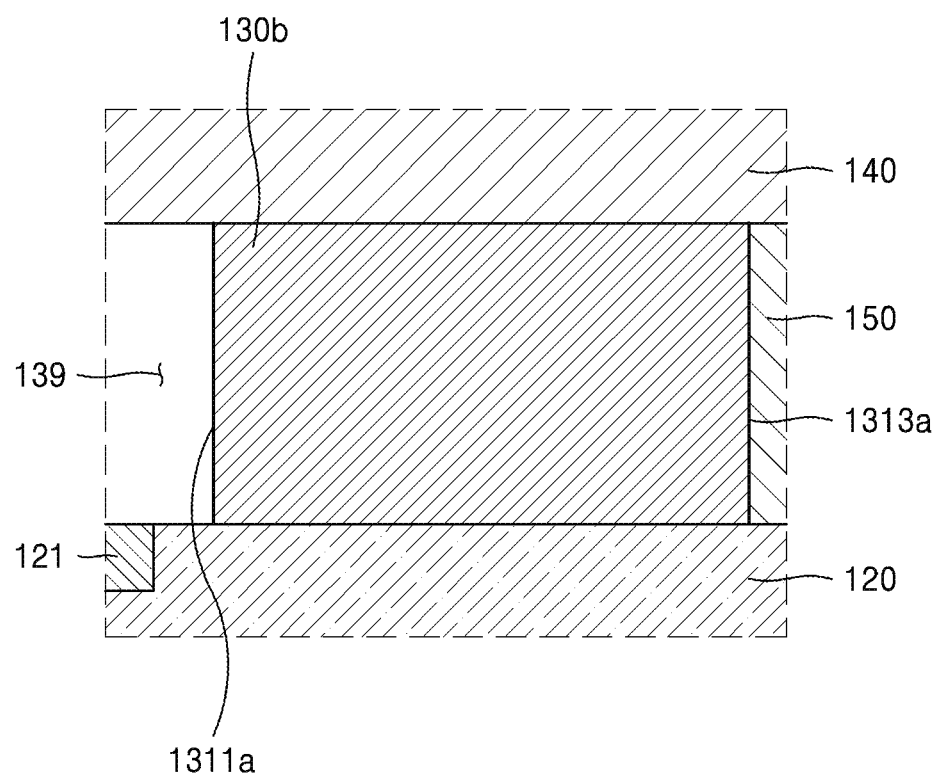

FIGS. 4 to 6 are each a cross-sectional view of a portion of the image sensor package 100 according to example embodiments of the inventive concept. FIGS. 4 to 6 each illustrate a region corresponding to the region III in FIG. 1.

Referring to FIG. 4, the image sensor package 100 may include a first adhesive layer 171 disposed between the dam structure 130 and the image sensor chip 120 and a second adhesive layer 173 disposed between the dam structure 130 and the transparent substrate 140. The first adhesive layer 171 may be disposed on a lower surface of the dam structure 130 to attach the dam structure 130 to the image sensor chip 120. The second adhesive layer 173 may be disposed on an upper surface of the dam structure 130 to attach the dam structure 130 to the transparent substrate 140.

Referring to FIG. 5, a dam structure 130a may include the dam main body 131, the first light absorption layer 135 on the inner wall 1311 of the dam main body 131 defining the opening 139, and a second light absorption layer 137 on an upper surface of the dam main body 131.

The second light absorption layer 137 may be formed to cover at least a portion of the upper surface of the dam main body 131. The second light absorption layer 137 may entirely cover the upper surface of the dam main body 131, or may partially cover the upper surface of the dam main body 131. The second light absorption layer 137 may include the same material as or a similar material to that of the first light absorption layer 135, and may have substantially the same characteristics (e.g., light absorption rate) as the ones of the first light absorption layer 135.

Terms such as "same," "equal," "planar," or "coplanar," as used herein when referring to orientation, layout, location, shapes, sizes, compositions, amounts, or other measures do not necessarily mean an exactly identical orientation, layout, location, shape, size, composition, amount, or other measure, but are intended to encompass nearly identical orientation, layout, location, shapes, sizes, compositions, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

The second light absorption layer 137 may be disposed between the transparent substrate 140 and the upper surface of the dam main body 131 and may be configured to absorb light incident on an upper surface of the dam structure 130a. The second light absorption layer 137 may absorb the light incident on the dam structure 130a together with the first light absorption layer 135, thereby preventing the light from reaching the sensing region 121 by being reflected from the dam structure 130a or transmitting through the dam structure 130a. Accordingly, the flare phenomenon may be prevented, and image quality obtained from the image sensor chip 120 may be improved. For example, the second light absorption layer 137 may be helpful to reduce unintended light that reaches to the image sensing region 121 of the image sensor chip 120.

Referring to FIG. 6, a dam structure 130b may uniformly include a light absorbing material as a whole. For example, the dam structure 130b may include a base material including a resin and a light absorbing material that is substantially uniformly distributed in the base material. For example, the dam structure 130b may include a black pigment, and the dam structure 130b may be entirely colored black. For example, each of an inner wall 1311a, an outer wall 1313a, an upper surface, and a lower surface of the dam structure 130b may be colored black.

In certain embodiments, the dam structure 130b may be formed of a black material, e.g., homogeneously. Using a homogeneous black material for the dam structure 130b may be beneficial for reducing manufacturing steps. On the other hand, using a dam structure 130 including a dam main body 131 and a light absorption layer 135/137 may be beneficial for choosing materials for the respective dam main body 131 and light absorption layer 135/137. For example, the dam main body 131 may be formed of a reliable material for the structure and to protect the opening 139 without side effects, and the light absorption layer 135/137 may be formed of a material having a high absorption rate of light without side effects.

FIGS. 7A to 7D are cross-sectional views for sequentially describing a method of manufacturing the dam structure 130, according to example embodiments of the inventive concept.

Figure 7A:
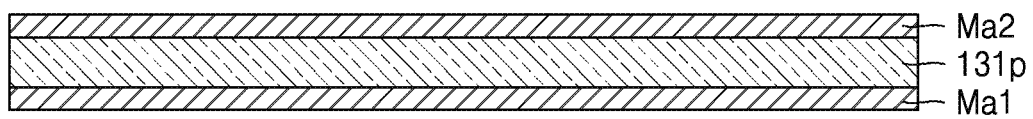
FIGS. 7A to 7D are cross-sectional views for sequentially describing a method of manufacturing a dam structure, according to example embodiments of the inventive concept.

Referring to FIG. 7A, a preliminary dam main body 131p having a plate shape is prepared, and a first mask layer Ma1 covering a lower surface of the preliminary dam main body 131p and a second mask layer Ma2 covering an upper surface of the preliminary dam main body 131p are formed.

Figure 7B:
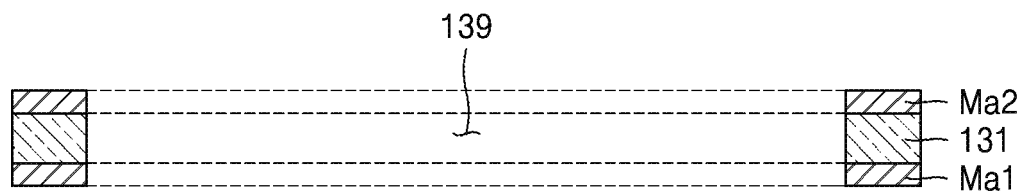

Referring to FIGS. 7A and 7B, a hole penetrating the preliminary dam main body 131p, the first mask layer Ma1, and the second mask layer Ma2 is formed. For example, the hole penetrating the preliminary dam main body 131p, the first mask layer Ma1, and the second mask layer Ma2 may be formed by a laser drilling process. As the hole penetrating the preliminary dam main body 131p, the first mask layer Ma1, and the second mask layer Ma2 is formed, the dam main body 131 having the opening 139 may be manufactured from the preliminary dam main body 131p.

Figure 7C:
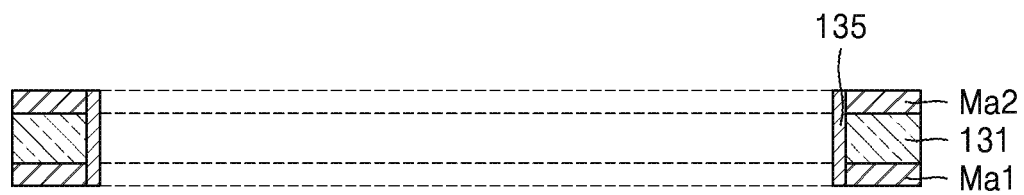

Referring to FIG. 7C, the first light absorption layer 135 may be formed on the inner wall 1311 of the dam main body 131. For example, the first light absorption layer 135 may be formed by a coating process, a spraying process, or a printing process. For example, the first light absorption layer 135 may be formed by attaching a film including a light absorbing material onto the inner wall 1311 of the dam main body 131. While the first light absorption layer 135 is formed, the lower surface and the upper surface of the dam main body 131 are covered by the first mask layer Ma1 and the second mask layer Ma2, respectively, and thus a light absorbing material is not formed on the lower surface and the upper surface of the dam main body 131.

Figure 7D:

Referring to FIGS. 7C and 7D, the first mask layer Ma1 and the second mask layer Ma2 are removed. As the first mask layer Ma1 is removed, the lower surface of the dam main body 131 may be exposed, and as the second mask layer Ma2 is removed, the upper surface of the dam main body 131 may be exposed.

In some example embodiments, a light absorbing material may be coated on at least one of the lower surface and the upper surface of the dam main body 131. For example, in order to form the dam structure 130 including the first light absorption layer 135 on the inner wall 1311 of the dam main body 131 and the second light absorption layer 137 on the upper surface of the dam main body 131 as illustrated in FIG. 5, the first mask layer Ma1 covering the lower surface of the preliminary dam main body 131p in FIG. 7A may be formed, but the second mask layer Ma2 covering the upper surface of the preliminary dam main body 131p in FIG. 7A may not be formed. In this case, in a process of forming the first light absorption layer 135, the second light absorption layer 137 covering the upper surface of the dam main body 131 may also be formed.

Figure 8A:
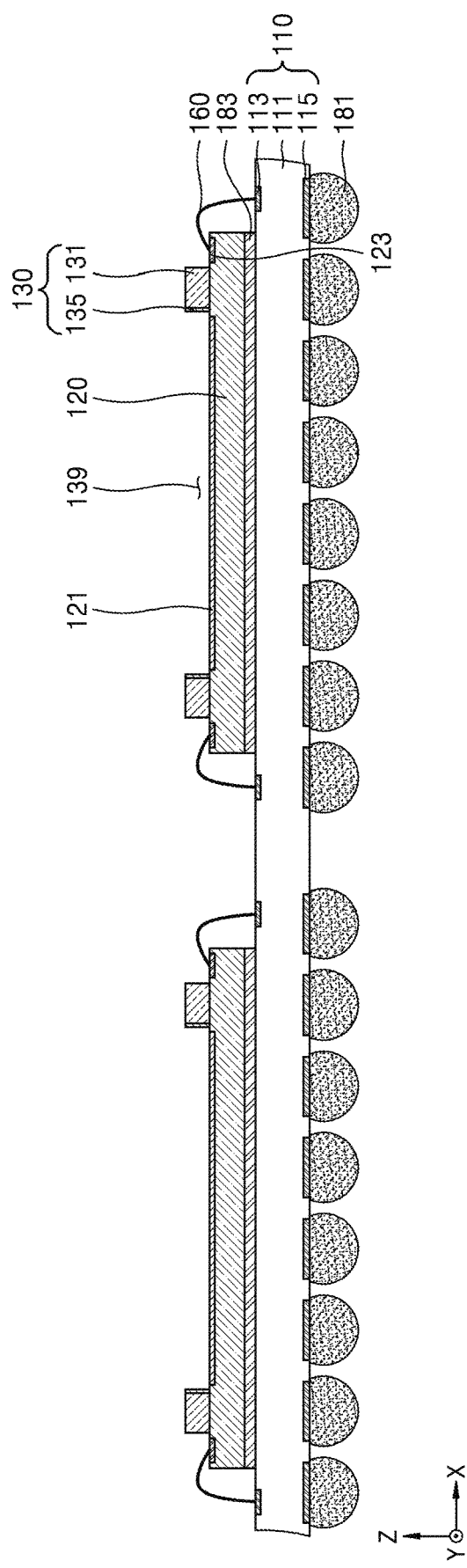
FIGS. 8A to 8C are cross-sectional views for sequentially describing a method of manufacturing an image sensor package, according to example embodiments of the inventive concept.
Figure 8B:
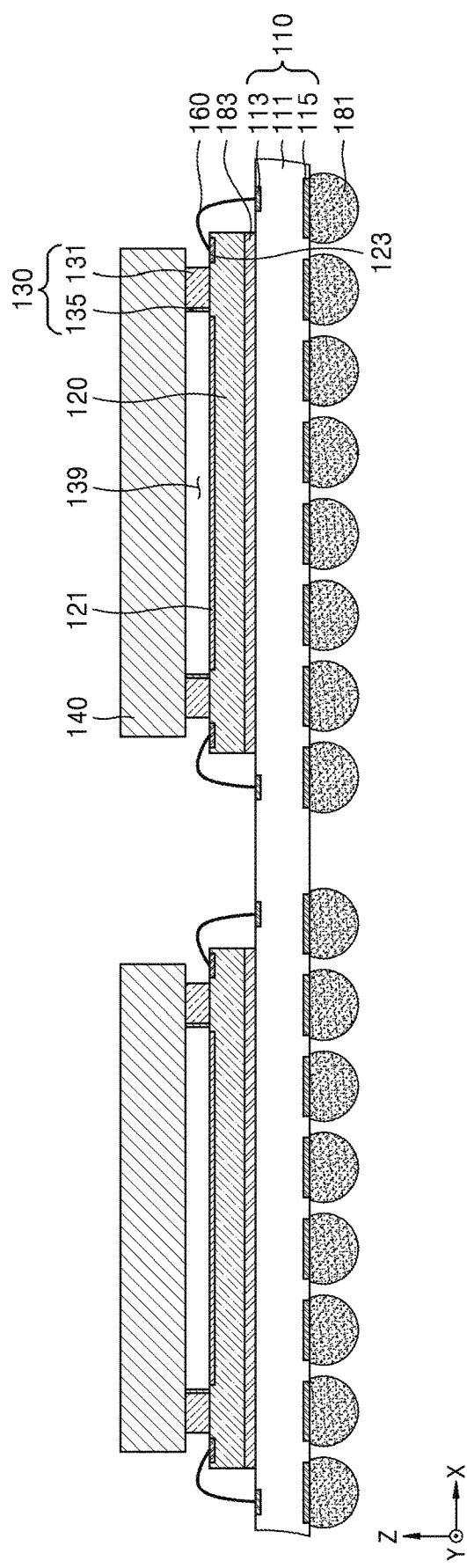
Figure 8C:
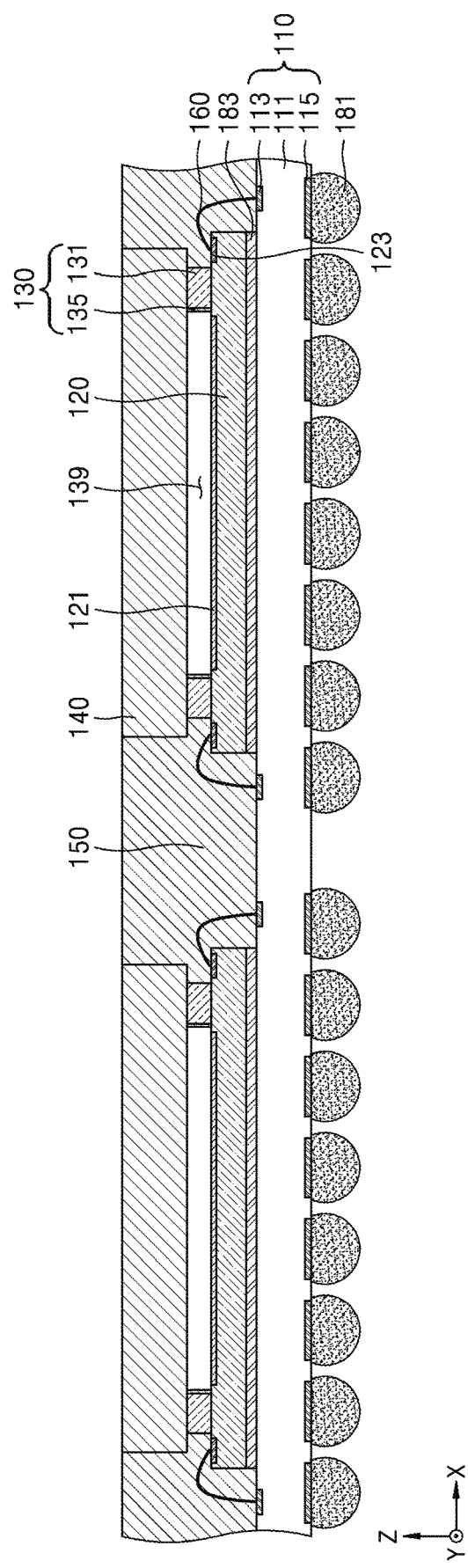

FIGS. 8A to 8C are cross-sectional views for sequentially describing a method of manufacturing an image sensor package, according to example embodiments of the inventive concept. Hereinafter, a method of manufacturing the image sensor package 100 shown in FIGS. 1 to 3 will be described with reference to FIGS. 8A to 8C.

Referring to FIG. 8A, the package substrate 110 is prepared, and the image sensor chip 120 may be mounted on the package substrate 110. The image sensor chip 120 may be attached onto the package substrate 110 through the chip adhesion member 183 disposed between the second surface of the image sensor chip 120 and the package substrate 110.

After the image sensor chip 120 is mounted on the package substrate 110, the conductive wire 160 electrically connecting the upper substrate pad 113 of the package substrate 110 to the connection pad 123 of the image sensor chip 120 may be formed. The conductive wire 160 may be formed through a wire bonding process and may include or be formed of a conductive material such as gold (Au), copper (Cu), or the like.

After the conductive wire 160 is formed, the dam structure 130 of the image sensor chip 120 is disposed. The dam structure 130 may be disposed on the outer region of the image sensor chip 120, and the sensing region 121 of the image sensor chip 120 may be exposed through the opening 139 of the dam structure 130.

Referring to FIG. 8B, the transparent substrate 140 is disposed on the dam structure 130. The transparent substrate 140 may be attached onto the dam structure 130 to cover the opening 139 of the dam structure 130.

Referring to FIG. 8C, the encapsulant 150 covering the side wall of the image sensor chip 120, the outer wall 1313 of the dam structure 130, and a side wall of the transparent substrate 140 is formed on the package substrate 110. In order to form the encapsulant 150, an encapsulating material may be injected onto the package substrate 110, and the encapsulating material may be cured. While the encapsulant 150 is formed, the dam structure 130 may block flow of the encapsulating material into a space between the lower surface of the transparent substrate 140 and the sensing region 121 of the image sensor chip 120.

After the encapsulant 150 is formed, a sawing process may be performed on the result of FIG. 8C. As the encapsulant 150 and the package substrate 110 are cut by the sawing process, the result of FIG. 8C may be divided into single image sensor packages 100 in a single package unit as illustrated in FIG. 1.

Figure 9:
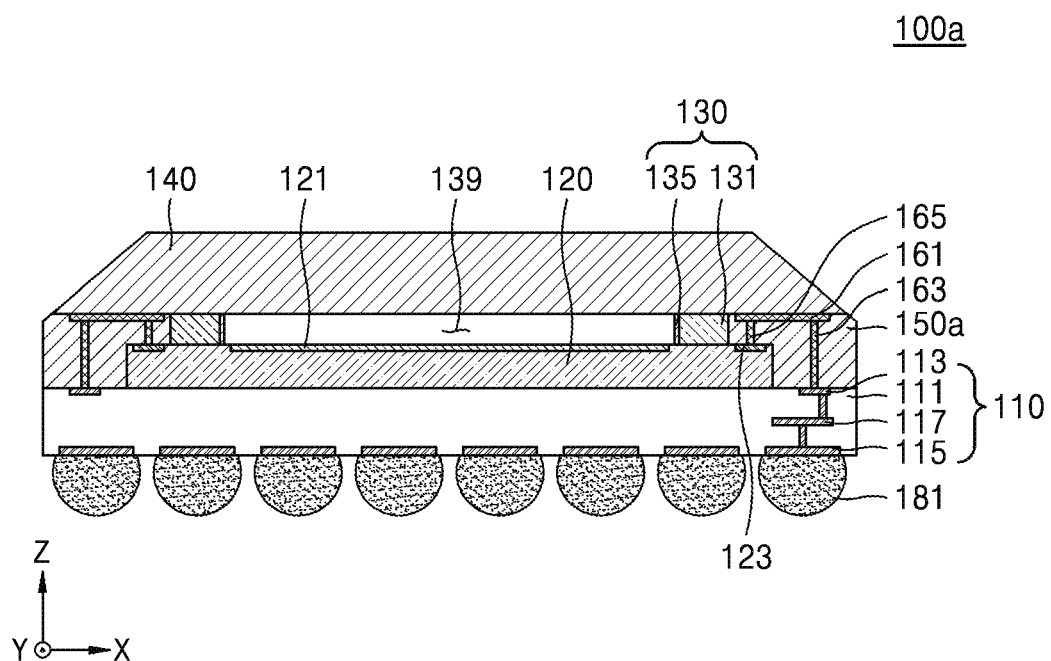
FIG. 9 is a cross-sectional view of an image sensor package according to example embodiments of the inventive concept.

FIG. 9 is a cross-sectional view of an image sensor package 100a according to example embodiments of the inventive concept. Hereinafter, a difference between the image sensor package 100 described with reference to FIGS. 1 to 3 and the image sensor package 100a of FIG. 9 will be mainly described.

Referring to FIG. 9, the image sensor package 100a may include a package substrate 110, an image sensor chip 120, a dam structure 130, a transparent substrate 140, and an encapsulant 150a. In FIG. 9, the image sensor package 100a includes the dam structure 130 illustrated in FIGS. 1 to 3, but the image sensor package 100a may include any one of the dam structures 130a and 130b described with reference to FIGS. 5 and 6.

The encapsulant 150a is disposed on the upper surface of the package substrate 110 and may cover the side wall of the image sensor chip 120 and the outer wall 1313 of the dam structure 130. The encapsulant 150a may cover the lower surface of the transparent substrate 140, and may not cover the side wall and the upper surface of the transparent substrate 140 so that the side wall and the upper surface of the transparent substrate 140 are exposed to the outside (e.g., outside the encapsulant 150a).

The image sensor package 100a may include a conductive connection pattern 161, a first conductive connector 163, and a second conductive connector 165. The conductive connection pattern 161, the first conductive connector 163, and the second conductive connector 165 may collectively form a conductive connection member for electrically connecting the image sensor chip 120 to the package substrate 110.

The conductive connection pattern 161 may be formed on the lower surface of the transparent substrate 140 and may have a line shape extending along the lower surface of the transparent substrate 140. For example, the conductive connection pattern 161 may be formed on the lower surface of the transparent substrate 140 by performing a wiring process. The first conductive connector 163 may extend between the conductive connection pattern 161 and the upper substrate pad 113 of the package substrate 110. The first conductive connector 163 may have a column or bump shape extending in a vertical direction between the conductive connection pattern 161 and the upper substrate pad 113 of the package substrate 110. The first conductive connector 163 may electrically connect the conductive connection pattern 161 to the upper substrate pad 113 of the package substrate 110. The second conductive connector 165 may have a column or bump shape extending in a vertical direction between the conductive connection pattern 161 and the connection pad 123 of the image sensor chip 120. The second conductive connector 165 may electrically connect the conductive connection pattern 161 to the connection pad 123 of the image sensor chip 120. FIG. 9 shows that corners of the transparent substrate 140 are inclined with respect to the top surface of the transparent substrate 140. This may be formed by the sawing process cutting the result of FIG. 8C into the single image sensor package 100a. In certain embodiments, the inclined corners of the transparent substrate 140 may be formed by an additional chamfering process to reduce/prevent cracks and/or chips in the transparent substrate 140.

FIGS. 10A to 10E are cross-sectional views for sequentially describing a method of manufacturing an image sensor package, according to example embodiments of the inventive concept. Hereinafter, a method of manufacturing the image sensor package 100a illustrated in FIG. 9 will be described with reference to FIGS. 10A to 10E.

Figure 10A:
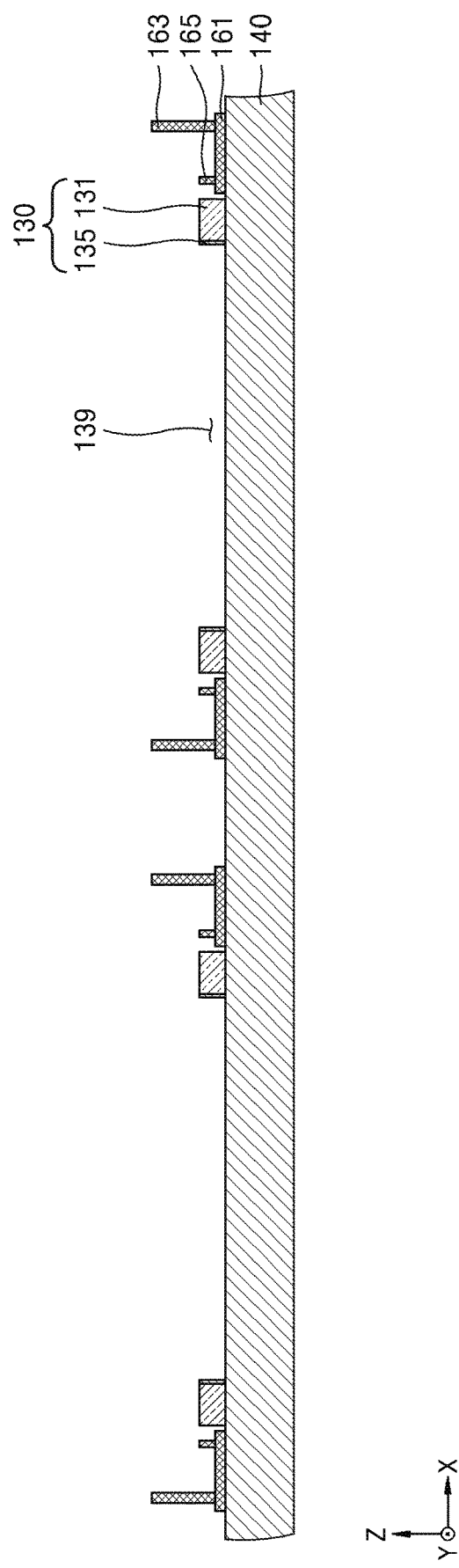
FIGS. 10A to 10E are cross-sectional views for sequentially describing a method of manufacturing an image sensor package, according to example embodiments of the inventive concept.

Referring to FIG. 10A, the transparent substrate 140 is prepared, and the conductive connection pattern 161, the first conductive connector 163, and the second conductive connector 165 are formed on the transparent substrate 140. After the conductive connection pattern 161, the first conductive connector 163, and the second conductive connector 165 are formed, the dam structure 130 is disposed on the transparent substrate 140.

Figure 10B:
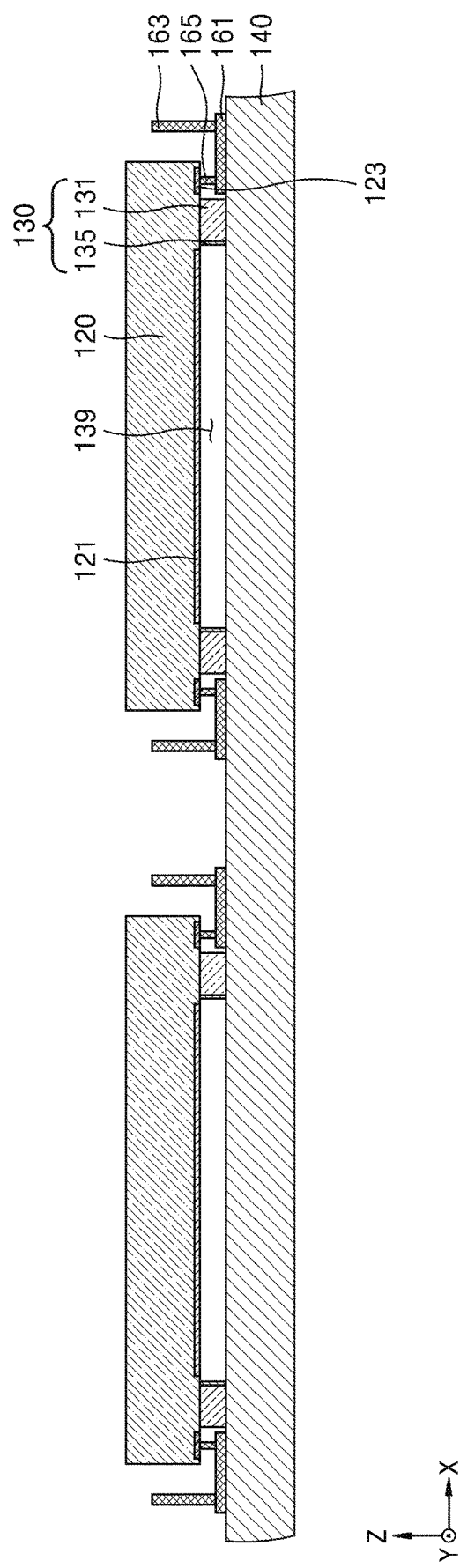

Referring to FIG. 10B, the image sensor chip 120 is disposed on the dam structure 130. The image sensor chip 120 may be disposed on the dam structure 130 so that the first surface of the image sensor chip 120 provided with the sensing region 121 and the connection pad 123 faces the transparent substrate 140. The image sensor chip 120 may be disposed on the dam structure 130 to cover the opening 139 of the dam structure 130 and such that the connection pad 123 of the image sensor chip 120 is in contact with the second conductive connector 165. In order to electrically connect the connection pad 123 of the image sensor chip 120 to the second conductive connector 165, for example, a thermocompression bonding process may be performed.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact.

Figure 10C:
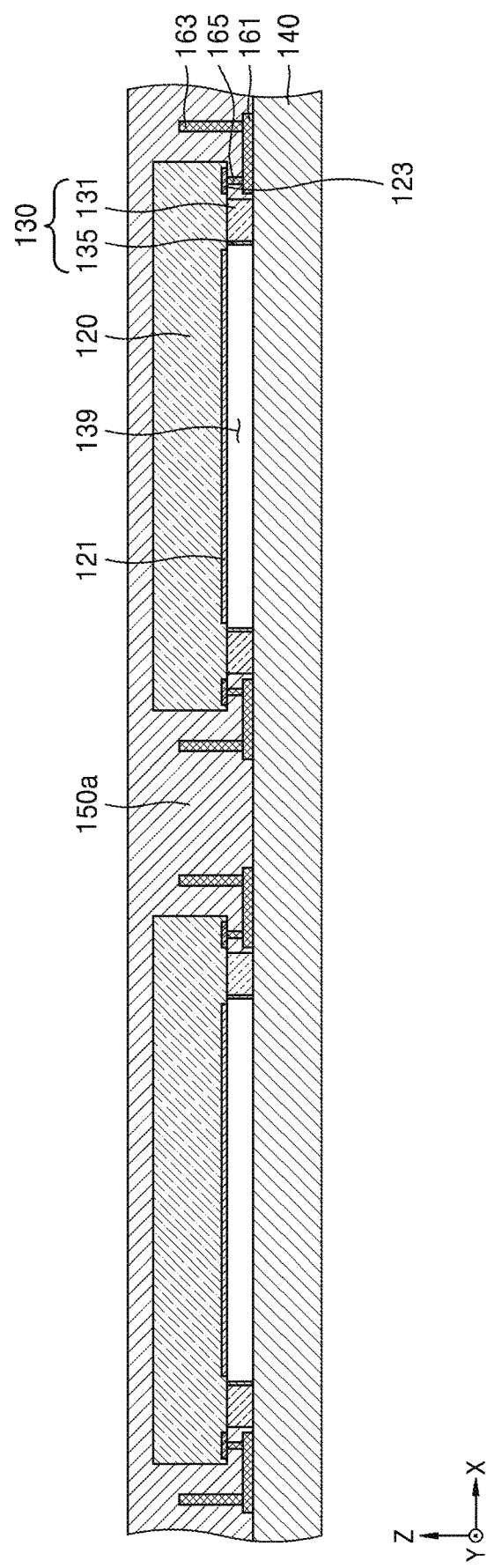

Referring to FIG. 10C, the encapsulant 150a covering the side wall of the image sensor chip 120 and the outer wall 1313 of the dam structure 130 is formed on the transparent substrate 140. In order to form the encapsulant 150a, an encapsulating material may be injected onto the transparent substrate 140, and the encapsulating material may be cured. While the encapsulant 150a is formed, the dam structure 130 may block flow of the encapsulating material into a space between the lower surface of the transparent substrate 140 and the sensing region 121 of the image sensor chip 120.

Figure 10D:
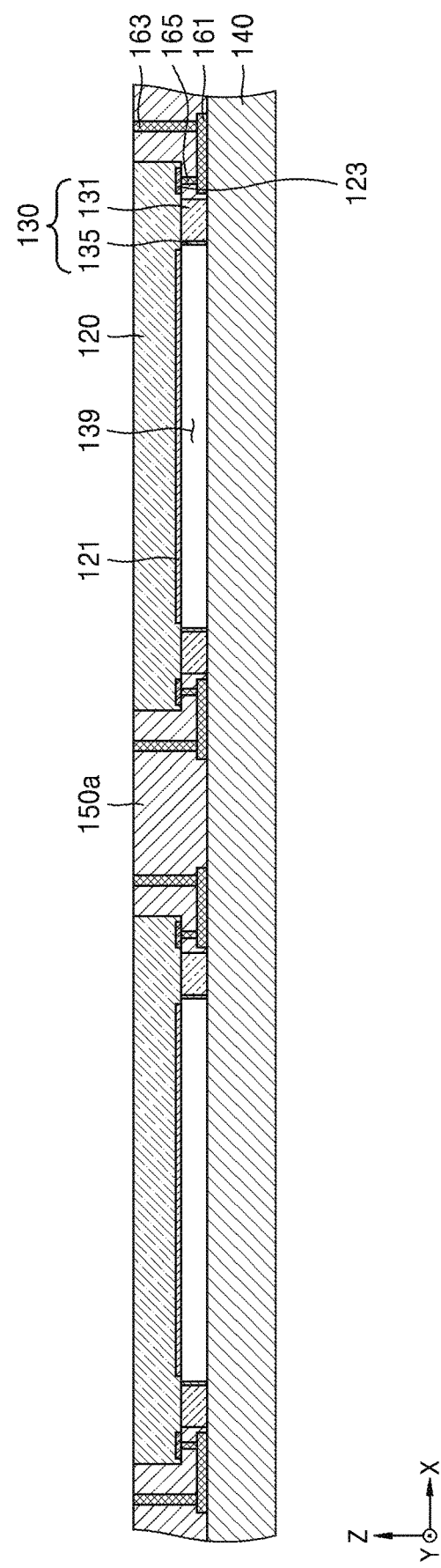

Referring to FIG. 10D together with FIG. 10C, a polishing process may be performed on the result of FIG. 10C. The polishing process may include, for example, a backgrinding process and a chemical mechanical polishing process. The polishing process may be performed at least so that the first conductive connector 163 is exposed through the encapsulant 150a. A portion of the encapsulant 150a and a portion of the image sensor chip 120 may be removed by the polishing process. As a result of the polishing process, a polished surface of the encapsulant 150a, a polished surface of the image sensor chip 120, and a polished surface of the first conductive connector 163 may be coplanar.

Figure 10E:
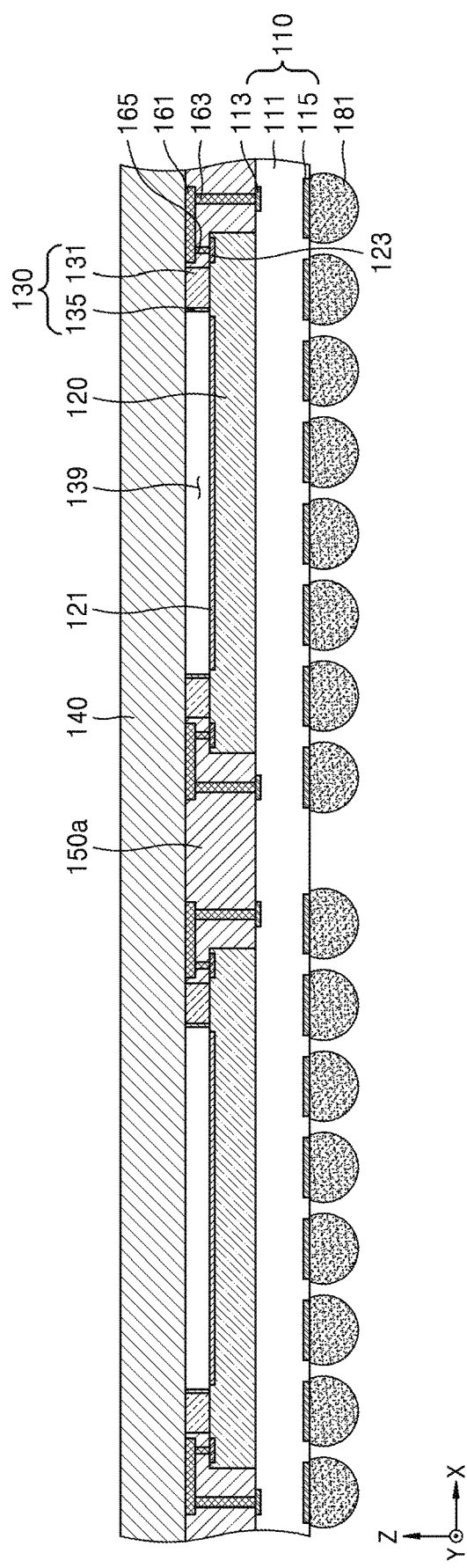

Referring to FIG. 10E, the result of FIG. 10D is turned over and disposed on the package substrate 110. The result of FIG. 10D may be disposed on the package substrate 110 so that the first conductive connector 163 is aligned with and connected to (e.g., contact) the upper substrate pad 113 of the package substrate 110. In order to connect the first conductive connector 163 to the upper substrate pad 113 of the package substrate 110, for example, a thermocompression bonding process may be performed. Alternatively, a conductive film may be interposed between the result of FIG. 10D and the package substrate 110. For example, an ACF (anisotropic conductive film) or a conductive material/pattern may be interposed between the upper substrate pad 113 of the package substrate and the first conductive connector 163.

After the result of FIG. 10D is disposed on the package substrate 110, a sawing process may be performed on the result of FIG. 10E. By the sawing process, the transparent substrate 140, the encapsulant 150a, and the package substrate 110 may be cut. When the transparent substrate 140, the encapsulant 150a, and the package substrate 110 are cut, the result of FIG. 10E may be divided into single image sensor packages 100a as illustrated in FIG. 9.

Figure 11:
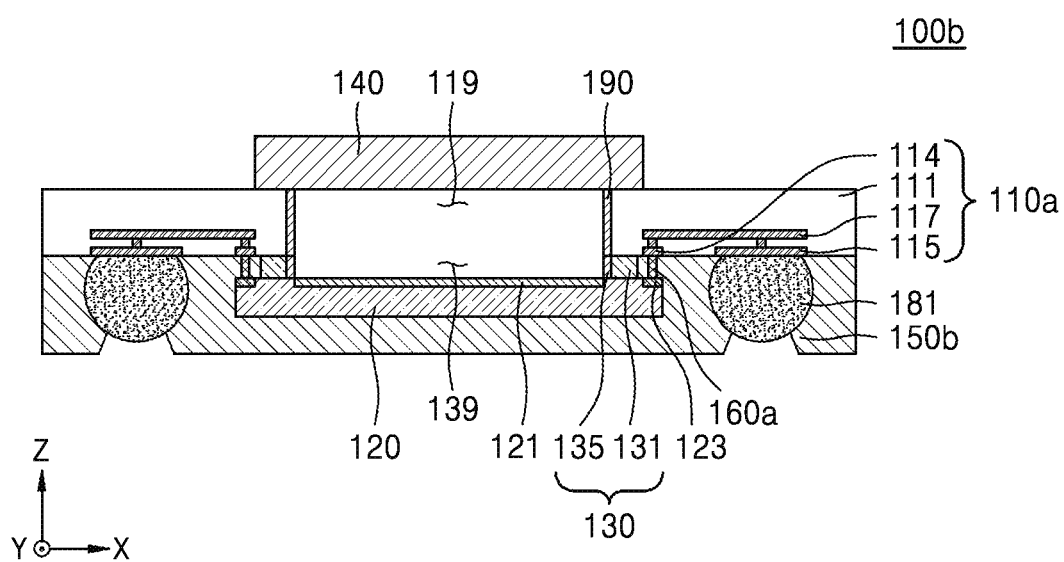
FIG. 11 is a cross-sectional view of an image sensor package according to example embodiments of the inventive concept.

FIG. 11 is a cross-sectional view of an image sensor package 100b according to example embodiments of the inventive concept. Hereinafter, a difference between the image sensor package 100 described with reference to FIGS. 1 to 3 and the image sensor package 100b of FIG. 11 will be mainly described.

Referring to FIG. 11, the image sensor package 100b may include a package substrate 110a, an image sensor chip 120, a dam structure 130, a transparent substrate 140, and an encapsulant 150b. In FIG. 11, the image sensor package 100b includes the dam structure 130 illustrated in FIGS. 1 to 3, but the image sensor package 100b may include any one of the dam structures 130a and 130b described with reference to FIGS. 5 and 6 instead of the dam structure 130 of FIG. 11.

The image sensor chip 120 may be disposed on a lower surface of the package substrate 110a, and the dam structure 130 may be disposed between the image sensor chip 120 and the lower surface of the package substrate 110a. The image sensor chip 120 and the package substrate 110a may be electrically connected through a conductive connector 160a extending between a substrate pad 114 provided on the lower surface of the package substrate 110a and the connection pad 123 of the image sensor chip 120.

The package substrate 110a may include a through hole 119 vertically penetrating the package substrate 110a. The through hole 119 of the package substrate 110a may communicate with the opening 139 of the dam structure 130. For example, the through hole 119 and the opening 139 are open to each other. The transparent substrate 140 may be attached onto the package substrate 110a so that the through hole 119 of the package substrate 110a is covered.

The through hole 119 of the package substrate 110a may have a horizontal width (i.e., a width in an X-direction and/or a Y-direction) that is substantially the same as that of the opening 139 of the dam structure 130. In this case, an inner wall of the package substrate 110a defining the through hole 119 of the package substrate 110a may be substantially in a straight line. For example, the inner wall of the package substrate 110a and the inner wall 1311 of the dam main body 131 may be coplanar in respective portions vertically corresponding to (e.g., vertically overlapping) each other. This may be beneficial for miniaturization of the image sensor package 100b in that the total area of the first light absorption layer 135 and a third light absorption layer 190 (described below) in a plan view is minimized. In some example embodiments, the through hole 119 of the package substrate 110a may have a horizontal width that is substantially different from that of the opening 139 of the dam structure 130. For example, the horizontal width of the through hole 119 of the package substrate 110a may be greater than that of the opening 139 of the dam structure 130. This may be beneficial for image sensor packages which need a wide incident angle of light in that pixels of the image sensor packages in the vicinity of the inner walls may receive light in a wider angle than the ones described above. Alternatively, the horizontal width of the through hole 119 of the package substrate 110a may be less than that of the opening 139 of the dam structure 130.

The encapsulant 150b is disposed on the lower surface of the package substrate 110a and may cover the side wall of the image sensor chip 120 and the outer wall 1313 of the dam structure 130. In addition, the encapsulant 150b may cover a portion of the external connection terminal 181, and may have an opening exposing the external connection terminal 181.

The image sensor package 100b may include a third light absorption layer 190 disposed on the inner wall of the package substrate 110a. The third light absorption layer 190 may be formed to cover at least a portion of the inner wall of the package substrate 110a. The third light absorption layer 190 may entirely cover the inner wall of the package substrate 110a, or may partially cover the inner wall of the package substrate 110a. In a plan view, the third light absorption layer 190 may have a ring shape continuously extending along the inner wall of the package substrate 110a. In addition, the third light absorption layer 190 may extend from a lower end of the inner wall of the package substrate 110a to an upper end thereof. For example, the third light absorption layer 190 may extend from a bottom of the inner wall of the package substrate 110a to a top of the inner wall of the package substrate 110a. The third light absorption layer 190 may include a material that is the same as or similar to that of the first light absorption layer 135 of the dam structure 130, and may have substantially the same characteristics.

According to example embodiments of the inventive concept, because a light absorption layer including a material having a high light absorption rate is disposed on the inner wall of the package substrate 110a and the inner wall 1311 (in FIG. 3) of the dam structure 130, light may be prevented from being reflected from the inner wall of the package substrate 110a and the inner wall 1311 of the dam structure 130 and irradiated to the sensing region 121 of the image sensor chip 120. Accordingly, a flare phenomenon, which occurs by the light that is reflected from the inner wall of the package substrate 110a and the inner wall 1311 of the dam structure 130 and reaches the sensing region 121 of the image sensor chip 120, may be prevented, and thus, the quality of an image obtained by using the image sensor chip 120 may be improved.

While the inventive concept has been particularly shown and described with reference to embodiments thereof, it will be understood that various changes in form and details may be made therein without departing from the spirit and scope of the following claims.

What is claimed is:

1. An image sensor package comprising:
a package substrate;
an image sensor chip on the package substrate;
a dam structure on the image sensor chip and comprising a dam main body having an opening and a first light absorption layer on an inner wall of the dam main body;
a transparent substrate on the dam structure; and
an encapsulant contacting the image sensor chip and an outer wall of the dam main body,
wherein the dam structure further comprises a second light absorption layer on an upper surface of the dam main body, and
wherein the second light absorption layer vertically overlaps the whole dam main body.

2. The image sensor package of claim 1, wherein the first light absorption layer comprises a carbon-group colorant.

3. The image sensor package of claim 1, wherein the first light absorption layer has a light absorption rate of 95% or more.

4. The image sensor package of claim 1, wherein the second light absorption layer is between the transparent substrate and the dam main body.

5. The image sensor package of claim 1, further comprising:
a first adhesive layer between the dam structure and the image sensor chip; and
a second adhesive layer between the dam structure and the transparent substrate.

6. The image sensor package of claim 1, wherein the encapsulant covers a side wall of the transparent substrate.

7. The image sensor package of claim 1, wherein the encapsulant covers a lower surface of the transparent substrate, and does not cover a side wall of the transparent substrate.

8. The image sensor package of claim 1, further comprising a conductive wire electrically connecting a substrate pad of the package substrate to a connection pad of the image sensor chip.

9. The image sensor package of claim 1, further comprising:
a conductive connection pattern extending along a surface of the transparent substrate;
a first conductive connector extending between the conductive connection pattern and a substrate pad of the package substrate; and
a second conductive connector extending between the conductive connection pattern and a connection pad of the image sensor chip.

10. The image sensor package of claim 1, wherein the first light absorption layer extends from an upper end of the inner wall of the dam main body to a lower end thereof, and has a ring shape continuously extending along the inner wall of the dam main body in a plan view.

11. An image sensor package comprising:
an image sensor chip including a sensing region including a plurality of unit pixels and an outer region around the sensing region;
a transparent substrate on the image sensor chip;
a dam structure disposed between the outer region of the image sensor chip and the transparent substrate and including a black pigment,
a first adhesive layer disposed between the dam structure and the image sensor chip and attaching the dam structure to the image sensor chip; and
a second adhesive layer disposed between the dam structure and the transparent substrate and attaching the dam structure to the transparent substrate.

12. The image sensor package of claim 11, wherein the dam structure comprises:
a dam main body having a ring shape extending along an edge of the sensing region of the image sensor chip; and
a first light absorption layer disposed on an inner wall of the dam main body and including the black pigment.

13. The image sensor package of claim 12, wherein the dam structure is disposed between the transparent substrate and the dam main body, and further comprises a second light absorption layer including the black pigment.

14. The image sensor package of claim 11, further comprising:
a package substrate disposed between the dam structure and the transparent substrate and having a through hole communicating with an opening of the dam structure;
a conductive connector extending between a substrate pad of the package substrate and a connection pad of the image sensor chip; and
a third light absorption layer disposed on an inner wall of the package substrate defining the through hole of the package substrate.

15. The image sensor package of claim 11, further comprising an encapsulant covering a side wall of the image sensor chip, a side wall of the transparent substrate, and an outer wall of the dam structure.

16. An image sensor package comprising:
an image sensor chip including a sensing region including a plurality of unit pixels and an outer region around the sensing region;

a dam main body disposed on the outer region of the image sensor chip and including an opening;

a package substrate disposed on the dam main body and including a through hole communicating with the opening of the dam main body;

a transparent substrate disposed on the package substrate to cover the through hole of the package substrate;

a wiring pattern extending in horizontal direction and embedded in the package substrate, the wiring pattern electrically connected to a first substrate pad and a second substrate pad, the first and second substrate pads formed on a lower surface of the package substrate;

a connection pad formed on an upper surface of the image sensor chip;

a connection conductor electrically connecting the connection page and the first substrate pad;

an external connection terminal disposed on the second substrate pad and electrically connected to the second substrate pad; and a light absorption layer disposed on at least one of an inner wall of the dam main body defining the opening and an inner wall of the package substrate defining the through hole of the package substrate.

17. The image sensor package of claim 16, wherein the light absorption layer comprises a black pigment and has a light absorption rate of 95% or more.

18. The image sensor package of claim 16, wherein the light absorption layer entirely covers the inner wall of the dam main body and the inner wall of the package substrate.

19. The image sensor package of claim 16, wherein the package substrate comprises a first substrate pad and a second substrate pad, and further comprises:

a conductive connector extending between the first substrate pad of the package substrate and a connection pad of the image sensor chip; and an external connection terminal on the second substrate pad of the package substrate.

\* \* \* \* \*